(12) United States Patent
Yamaguchi

(10) Patent No.: US 11,079,692 B2
(45) Date of Patent: Aug. 3, 2021

(54) DETECTION APPARATUS, EXPOSURE APPARATUS, AND ARTICLE MANUFACTURING METHOD

(71) Applicant: CANON KABUSHIKI KAISHA, Tokyo (JP)

(72) Inventor: Wataru Yamaguchi, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/914,976

(22) Filed: Jun. 29, 2020

(65) Prior Publication Data

US 2021/0003930 A1    Jan. 7, 2021

(30) Foreign Application Priority Data

Jul. 1, 2019 (JP) .............................. JP2019-123134

(51) Int. Cl.
*G03F 9/00* (2006.01)

(52) U.S. Cl.
CPC .......... *G03F 9/7088* (2013.01); *G03F 9/7026* (2013.01)

(58) Field of Classification Search
CPC ............ G03F 7/70641; G03F 7/70141; G03F 9/7088; G03F 9/7026
USPC ........................................ 355/52, 53, 55, 67
See application file for complete search history.

(56) References Cited

U.S. PATENT DOCUMENTS

| 2015/0286149 A1* | 10/2015 | Izumi | .................. G03F 9/70 355/67 |
| 2017/0219935 A1* | 8/2017 | Chen | .................. H01L 21/027 |
| 2018/0101104 A1 | 4/2018 | Shibazaki | |

FOREIGN PATENT DOCUMENTS

| JP | 2009054736 A | 3/2009 |
| JP | 5120691 B2 | 1/2013 |
| JP | 2017215556 A | 12/2017 |

OTHER PUBLICATIONS

Search Report and Written Opinion issued in Singaporean Appln. No. 10202005801X dated Feb. 9, 2021.

* cited by examiner

*Primary Examiner* — Hung Nguyen
(74) *Attorney, Agent, or Firm* — Rossi, Kimms & McDowell LLP

(57) ABSTRACT

A detection apparatus for detecting a plurality of marks arranged on a substrate is provided. The apparatus includes a stage which supports the substrate, a plurality of detectors arranged apart from each other and configured to detect different marks of the plurality of marks arranged on the substrate, and a processor. For each of predetermined combinations of the detectors, the processor inclines a reference member supported by the stage at an inclination according to information on a position of a detection region and a focal position of each detector, and aligns a reference mark arranged on the reference member with each detector, and the processor obtains a measurement offset value of each of the plurality of detectors based on measurement values each acquired by the alignment performed for each of the plurality of predetermined combinations.

19 Claims, 12 Drawing Sheets

FIG. 7A

|  | MEASUREMENT VALUE OF MARK DETECTION SYSTEM | | |
|---|---|---|---|
|  | a | b | c |
| INCLINATION INFORMATION | Aa | Ab | --- |
|  | --- | Bb | Bc |
|  | Ca | --- | Cc |
|  | Da | Db | Dc |

FIG. 7B

|  | MEASUREMENT OFFSET OF MARK DETECTION SYSTEM | | |
|---|---|---|---|
|  | a | b | c |
| INCLINATION INFORMATION | $-\Delta A$ | (REFERENCE) | --- |
|  | --- | $\Delta b1$ | $\Delta b1 + \Delta B$ |
|  | $-\Delta A + \Delta c$ | --- | $-\Delta A + \Delta c + \Delta C$ |
|  | $\Delta b2 - \Delta D1$ | $\Delta b2$ | $\Delta b2 + \Delta D2$ |

DETECTION APPARATUS, EXPOSURE APPARATUS, AND ARTICLE MANUFACTURING METHOD

BACKGROUND OF THE INVENTION

Field of the Invention

The present invention relates to a detection apparatus that detects a mark arranged on a substrate, an exposure apparatus, and an article manufacturing method.

Description of the Related Art

In recent years, due to high integration and miniaturization of semiconductor integrated circuits, the line width of a pattern formed on a substrate has become extremely small. Along with this, further miniaturization is required in a lithography process of forming a resist pattern on a substrate.

In a step-and-repeat type exposure apparatus or a step-and-scan type exposure apparatus, exposure light is imaged at a predetermined position on a substrate through a projection optical system and a stage with the substrate placed thereon is relatively moved to form a pattern on the substrate. Therefore, in order to meet the demand for pattern miniaturization, it is important to accurately align the relative positions of the substrate and the exposure light.

Conventionally, prior to pattern formation, a method (global alignment) is performed in which the positions of alignment marks formed in the vicinity of shot regions on a substrate are measured and the arrangement of the shot regions is obtained to perform alignment. In global alignment, in order to improve the alignment accuracy of the substrate, there is known a method in which the number of alignment marks to be measured is increased and statistical processing is performed, thereby improving the alignment accuracy. However, there is a problem that the throughput decreases because the time required to measure the alignment marks increases. To address this, in order to achieve both the increase in the number of alignment marks and the reduction in measurement time, there has been proposed a technique of detecting a plurality of alignment marks on a substrate using a plurality of mark detection systems.

Japanese Patent Laid-Open No. 2009-54736 describes a method of aligning the same mark with each of a plurality of mark detection systems capable of moving a detection region and obtaining a measurement offset of each of the plurality of mark detection systems based on measurement results. With this technique, a shift of the measurement position caused by a difference in performance among the plurality of mark detection systems is corrected, and a plurality of alignment marks on a substrate can be efficiently and highly accurately measured.

Japanese Patent Laid-Open No. 2017-215556 describes a method of, when a plurality of alignment marks on a substrate are simultaneously detected in a plurality of mark detection systems, estimating and correcting a measurement error caused by defocus between the mark detection system and the substrate. With this technique, the measurement error caused by the defocus upon measuring the plurality of marks using the plurality of mark detection systems is reduced, and the plurality of marks on the substrate can be measured at high speed and with high accuracy.

Japanese Patent No. 5120691 describes a method of focusing a plurality of marks on a reference member with respect to a plurality of mark detection systems each capable of moving a detection region, and simultaneously detecting the plurality of marks, thereby acquiring information of the positional relationship of the plurality of mark detection systems. This makes it possible to acquire the detection position information of the plurality of mark detection systems in a shorter time than in a case in which one mark on the reference member is sequentially aligned with each of the plurality of mark detection systems.

However, when the orientation of the substrate with respect to the mark detection apparatus is changed to align the mark so as to be located within the detection region and the depth of focus of the detector, the measurement value of the mark changes in accordance with the change in orientation of the substrate. Therefore, the measurement values of the plurality of marks on the substrate shift, and the alignment accuracy of the substrate and the exposure light can decrease.

Japanese Patent Laid-Open No. 2009-54736 describes the method of obtaining a measurement offset and correcting a measurement error caused by a difference in performance among a plurality of detectors. However, if the measurement value shifts in accordance with the change in orientation of the substrate with respect to the mark detection apparatus, an error occurs in the measurement offset, and the alignment accuracy of the substrate decreases. Further, in the method of estimating and correcting a shift of the measurement value caused by the telecentricity of an optical system and defocus as described in Japanese Patent Laid-Open No. 2017-215556, a shift of the measurement value caused by a change in orientation of the substrate is not considered, so that the measurement accuracy can decrease. Further, in the method of focusing a plurality of marks on a reference member with respect to a plurality of detectors and measuring the marks as described in Japanese Patent No. 5120691, an error caused by a difference between marks occurs, so that it is difficult to accurately correct a shift of the measurement value caused by a difference in performance among the plurality of detectors.

SUMMARY OF THE INVENTION

The present invention provides a technique advantageous in achieving both the speed and the accuracy in detection of a plurality of marks arranged on a substrate.

The present invention in its one aspect provides a detection apparatus for detecting a plurality of marks arranged on a substrate, comprising a stage configured to support the substrate and be capable of changing a position and an orientation of the substrate, a plurality of detectors arranged apart from each other and configured to detect different marks of the plurality of marks arranged on the substrate supported by the stage, and a processor configured to obtain a measurement offset value of each of the plurality of detectors, wherein, for each of a plurality of predetermined combinations of the detectors selected from the plurality of detectors, the processor inclines a reference member supported by the stage at an inclination according to information on a position of a detection region and a focal position of each detector, and aligns a reference mark arranged on the reference member with each detector, and the processor obtains the measurement offset value of each of the plurality of detectors based on measurement values each acquired by the alignment performed for each of the plurality of predetermined combinations.

Further features of the present invention will become apparent from the following description of exemplary embodiments (with reference to the attached drawings).

BRIEF DESCRIPTION OF THE DRAWINGS

FIGS. 7A and 7B are tables for explaining the method of calculating correction information according to the first embodiment;

DESCRIPTION OF THE EMBODIMENTS

Figure 1:
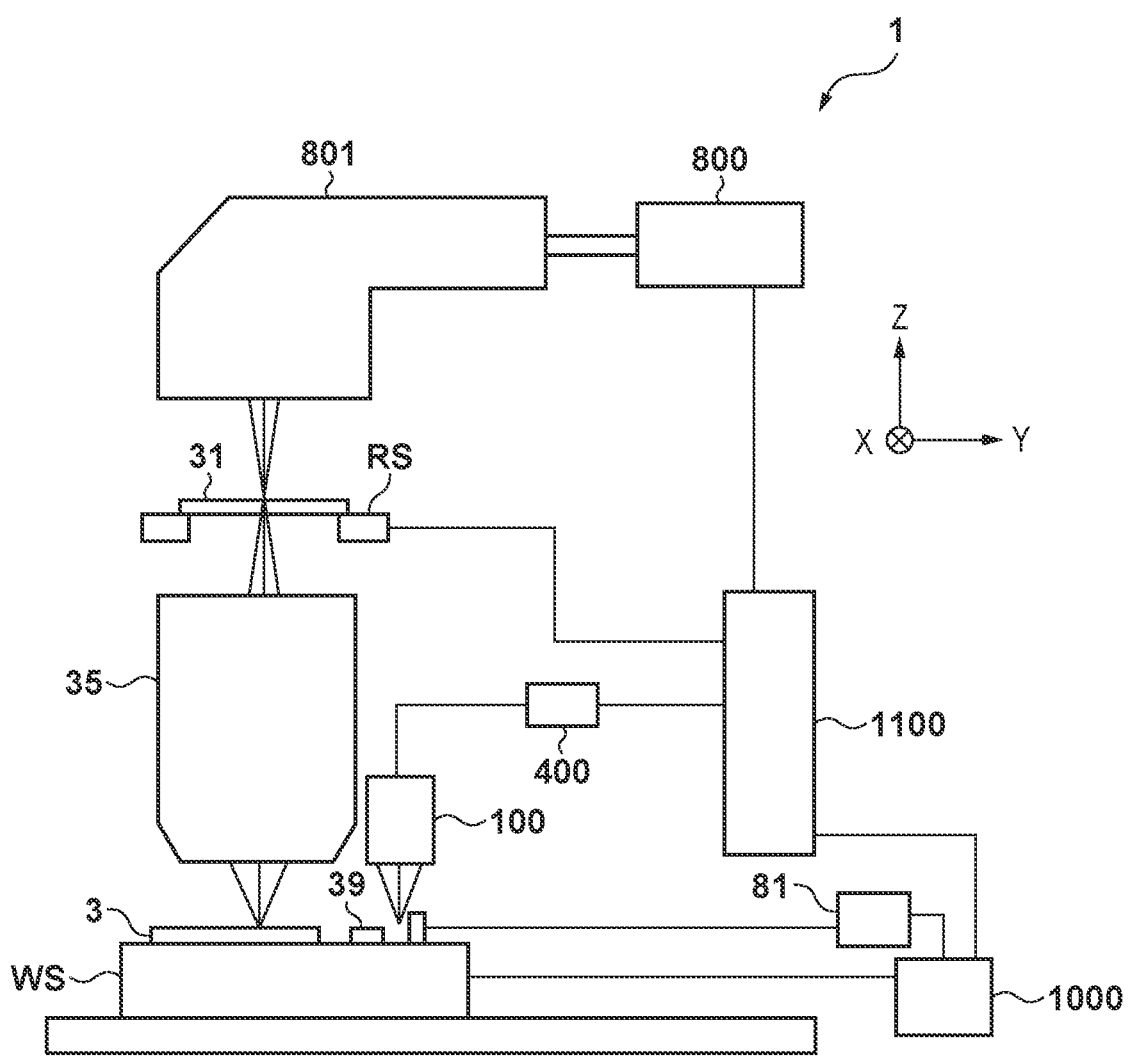
FIG. 1 is a view showing the arrangement of an exposure apparatus according to the first embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

FIG. 1 is a view showing the arrangement of an exposure apparatus 1 that includes a detection apparatus 100 for detecting a mark and exposes a substrate according to an embodiment. Note that in the specification and the accompanying drawings, directions will be indicated on an XYZ coordinate system in which the surface (generally a horizontal surface) of a wafer 3 as a substrate is defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively.

The exposure apparatus 1 includes an illumination device 800, a reticle stage RS on which a reticle 31 as an original (mask) is placed, a projection optical system 35, a wafer stage WS on which the wafer 3 as a substrate is placed, the detection apparatus 100, and an arithmetic processor 400. A reference member 39 is arranged on the wafer stage WS. A controller 1100 includes a CPU and a memory, and is electrically connected to each of the illumination device 800, the reticle stage RS, the wafer stage WS, and the detection apparatus 100 to control the operation of the entire exposure apparatus. For example, the controller 1100 controls positioning of the substrate based on detection results of a plurality of marks obtained by the detection apparatus 100, the marks being arranged on the substrate supported by the wafer stage WS. The controller 1100 can function as the processor of the detection apparatus 100, the processor performing calculation of a measurement value, calculation of a measurement offset value, a correction operation, control, or the like upon detecting a mark on the wafer 3 by the detection apparatus 100.

The illumination device 800 includes a light source unit that illuminates the reticle 31 with a circuit pattern formed thereon. For example, a laser is used as the light source. The laser to be used can be, for example, an ArF excimer laser having a wavelength of about 193 nm or a KrF excimer laser having a wavelength of about 248 nm, but the type of light source is not limited to the excimer laser. More specifically, an F2 laser having a wavelength of about 157 nm or EUV (Extreme Ultraviolet) light having a wavelength of 20 nm or less may be used.

An illumination optical system 801 illuminates the reticle 31 while shaping a light beam emitted from the illumination device 800 into a predetermined shape suitable for exposure. The illumination optical system 801 can include a lens, a mirror, an optical integrator, a diaphragm, and the like in order to perform a function of uniformly illuminating the reticle 31 or a polarizing illumination function.

The reticle 31 is, for example, a quartz mask (original) on which a circuit pattern to be transferred to a wafer is formed, and is supported and driven by the reticle stage RS. Diffracted light emitted from the reticle 31 passes through the projection optical system 35 and is projected onto the wafer 3. The reticle 31 and the wafer 3 are arranged in an optically conjugate relationship. The pattern of the reticle 31 is transferred to the wafer 3 by scanning the reticle 31 and the wafer 3 at a speed ratio of a reduction ratio. Note that the exposure apparatus 1 is provided with a reticle detection apparatus of light oblique-incidence type (not shown), so that the position of the reticle 31 is detected by the reticle detection apparatus, and the reticle stage RS is driven to arrange the reticle 31 at a predetermined position.

The reticle stage RS supports the reticle 31 via a reticle chuck (not shown), and is connected to a moving mechanism (not shown). The moving mechanism is formed by a linear motor or the like, and can move the reticle 31 by driving the reticle stage RS in the X-axis direction, the Y-axis direction, the Z-axis direction, and the rotation directions around the respective axes.

The projection optical system 35 has a function of imaging a light beam from an object plane on an image plane and, in this embodiment, images the diffracted light having passed through the pattern formed on the reticle 31 on the wafer 3. The projection optical system 35 can be an optical system (catadioptric optical system) including a plurality of lens elements and at least one concave mirror, or an optical system including a plurality of lens elements and at least one diffractive optical element such as kinoform.

A photoresist is applied onto the wafer 3. Note that in this embodiment, the wafer 3 is a detection target object for detecting the position of the mark on the wafer 3 by the detection apparatus 100. The wafer 3 is also a detection target object for detecting the surface position of the wafer 3 by a surface position detection apparatus (not shown). Note that the wafer 3 may be a liquid crystal substrate or another processing target object.

The wafer stage WS is configured to support the wafer 3 by a wafer chuck (not shown) and be capable of changing the position and orientation of the wafer 3. Similar to the reticle stage RS, the wafer stage WS uses a linear motor to move the wafer 3 in the X direction, the Y direction, the Z direction, and the rotation directions around the respective axes. In addition, the position of the reticle stage RS and the position of the wafer stage WS are monitored by, for example, a 6-axis interferometer 81 or the like, and a stage position controller 1000 drives the both stages at a constant speed ratio.

Next, with reference to FIG. 2A, an arrangement example of the detection apparatus 100 will be described. The detection apparatus 100 includes a plurality of detectors arranged apart from each other so as to detect different marks of the plurality of marks arranged on the wafer 3. In this embodiment, the plurality of detectors include three detectors, that is, a first detector 21a, a second detector 21b, and a third detector 21c. In the embodiment, the plurality of detectors 21a, 21b, and 21c are arranged at different positions along the X direction. In addition, the detection apparatus 100 includes a plurality of driving mechanisms 22a, 22b, and 22c that hold the plurality of detectors 21a, 21b, and 21c, respectively, and can drive the plurality of detectors 21a, 21b, and 21c with respect to a frame 23 in the X direction with a predetermined stroke, respectively. The detection apparatus 100 can individually adjust the X positions of the detection regions of the plurality of detectors 21a, 21b, and 21c by individually controlling the plurality of driving mechanisms 22a, 22b, and 22c. Note that it suffices here as long as the relative positions of the detection regions of the plurality of detectors 21a, 21b, and 21c can be adjusted at least along the X direction by the plurality of driving mechanisms 22a, 22b, and 22c. Of course, the driving mechanism may be configured to be cable of performing driving not only in the X direction, but also in the Y direction or the Z direction. Further, the detector 21b located at the center among the plurality of detectors 21a, 21b, and 21c may not be provided with a driving mechanism, and the relative position of the detection region of the detector 21b may be adjusted using the driving mechanism 22a and the driving mechanism 22c. Note that in the following description, when it is not necessary to specify which one of the plurality of detectors 21a, 21b, and 21c is mentioned, it may be simply referred to as the detector 21.

Figure 2B:
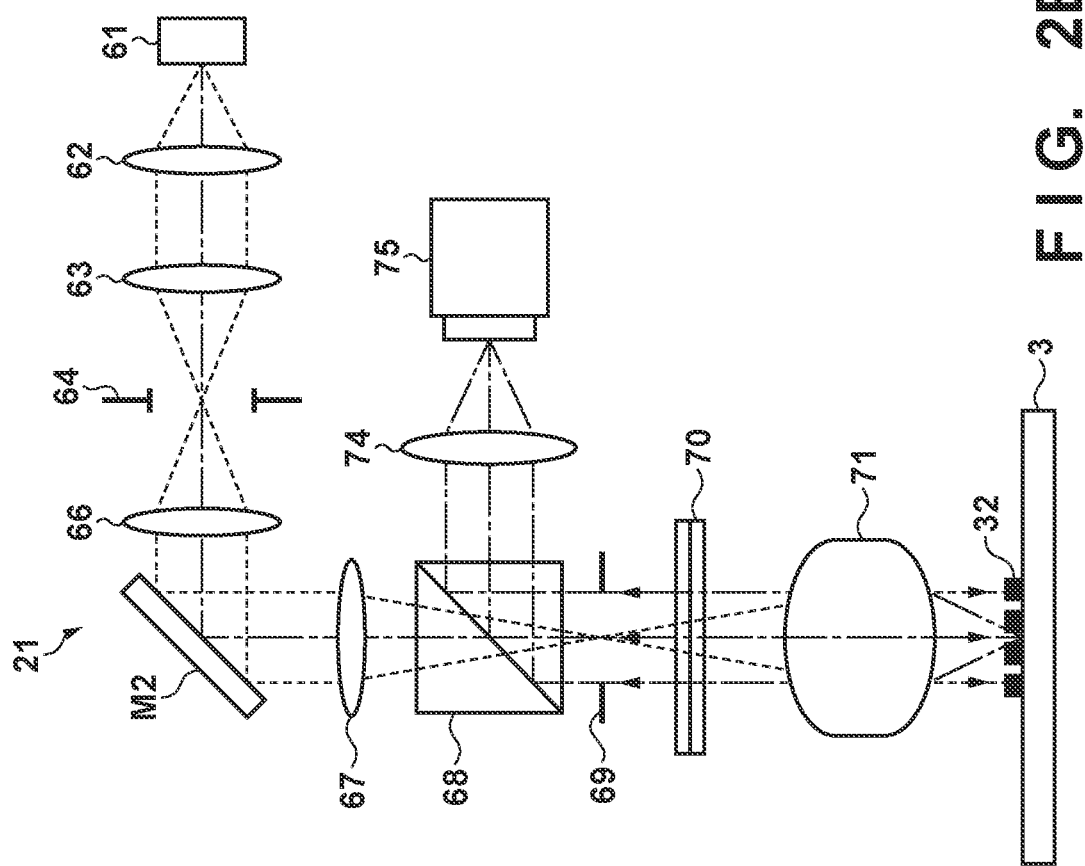
FIGS. 2A and 2B are views showing an arrangement example of a detection apparatus according to the first embodiment.
Figure 2A:
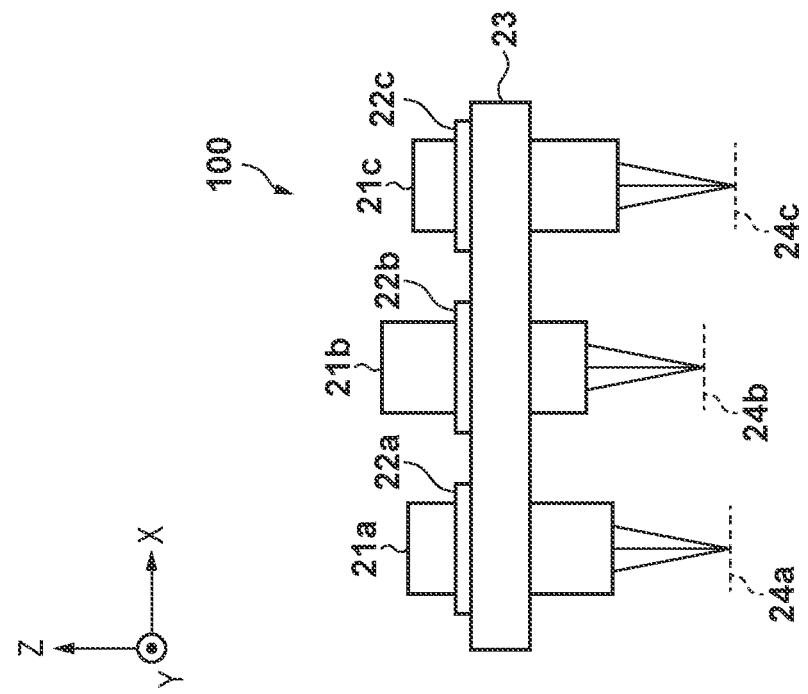

FIG. 2B is a view showing an arrangement example of the detector 21. The detector 21 can include an illumination system that illuminates the wafer 3 with light emitted from a light source 61, and an imaging system that forms an image of a mark 32 provided on the wafer 3. The illumination system can include illumination optical systems 62, 63, and 66, an illumination aperture stop 64, a mirror M2, a relay lens 67, a polarization beam splitter 68, a λ/4 plate 70, and an objective optical system 71. The imaging system includes the objective optical system 71, the λ/4 plate 70, a detection aperture stop 69, the polarization beam splitter 68, and an imaging optical system 74, and is configured to image the reflected light from the mark 32 on a sensor 75. The controller 1100 can obtain the coordinate position of the mark based on the position information of the wafer stage WS measured by the interferometer 81 and the signal waveform detected by the detector 21.

In the detector 21, light emitted from the light source 61 passes through the illumination optical systems 62 and 63 and reaches the illumination aperture stop 64 arranged at a position conjugate with the wafer 3. At this time, the light beam diameter at the illumination aperture stop 64 is sufficiently smaller than the light beam diameter at the light source 61. The light having passed through the illumination aperture stop 64 passes through the illumination optical system 66, the mirror M2, and the relay lens 67 and is guided to the polarization beam splitter 68. Here, the polarization beam splitter 68 transmits P-polarized light parallel to the Y direction and reflects S-polarized light parallel to the X direction. Therefore, the P-polarized light transmitted through the polarization beam splitter 68 passes through the λ/4 plate 70 via the detection aperture stop 69 to be converted into circularly polarized light, passes through the objective optical system 71, and Koehler-illuminates the mark 32 formed on the wafer 3.

The light reflected, diffracted, and scattered by the mark 32 passes through the objective optical system 71 again, then passes through the λ/4 plate 70 to be converted from the circularly polarized light into S-polarized light, and reaches the detection aperture stop 69. Here, the polarization state of the light reflected by the mark 32 is circular polarization that is reverse to the circular polarization of the light applied to the mark 32. That is, when the polarization state of the light applied to the mark 32 is clockwise circular polarization, the polarization state of the light reflected by the mark 32 is counterclockwise circular polarization. Further, the detection aperture stop 69 switches the numerical aperture of the reflected light from the mark 32 by changing the aperture amount in accordance with a command from the controller 1100. The light having passed through the detection aperture stop 69 is reflected by the polarization beam splitter 68 and guided to the sensor 75 via the imaging optical system 74. Therefore, the polarization beam splitter 68 separates the optical path of the illumination light to the wafer 3 and the optical path of the reflected light from the wafer 3, and an image of the mark 32 provided on the wafer 3 is formed on the sensor 75.

Figure 3A:
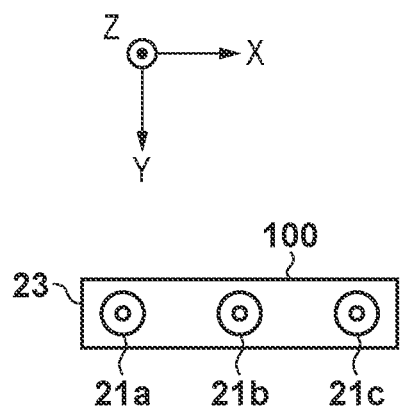
FIGS. 3A to 3D are views for explaining a method of detecting marks using the detection apparatus according to the first embodiment.
Figure 3B:
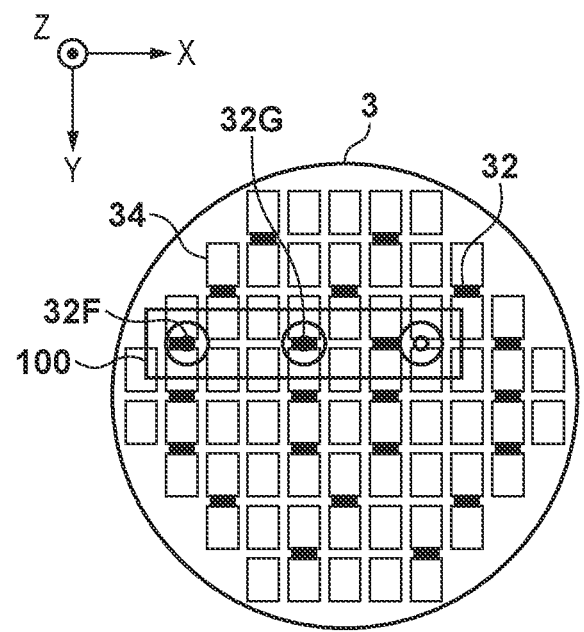
Figure 3C:
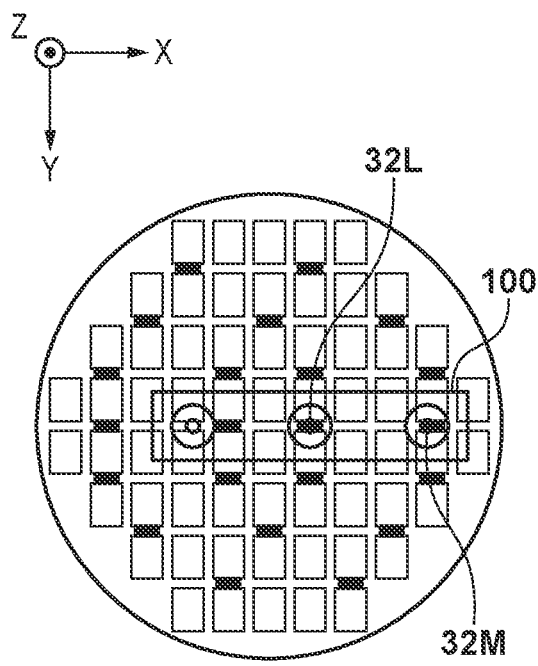
Figure 3D:
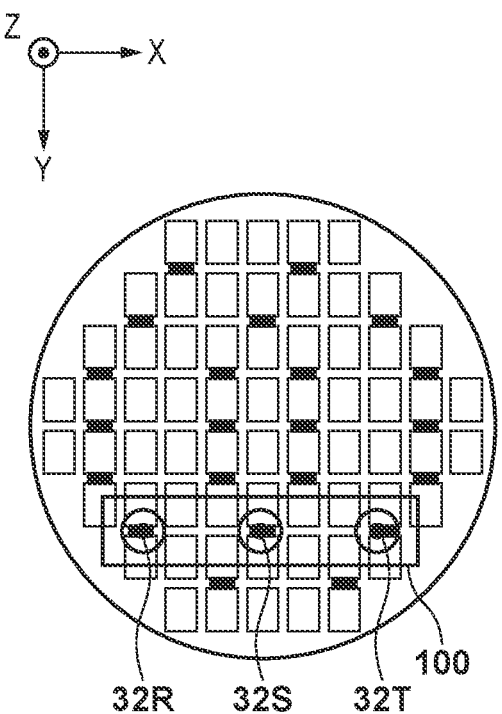

Next, a method of measuring the mark 32 on the wafer 3 using the detection apparatus 100 will be described with reference to FIGS. 3A to 3D. FIG. 3A is a plan view of the detection apparatus 100 shown in FIG. 2A viewed from the Z direction. As shown in FIG. 3A, the plurality of detectors 21a, 21b, and 21c of the detection apparatus 100 are arranged apart from each other so as to detect different marks of the plurality of marks. FIGS. 3B and 3C are views showing the positional relationship between the wafer 3 and the detection apparatus 100 at different points of time during a measurement operation. In consideration of the productivity, the detection apparatus 100 measures the marks 32 formed in a part of the entire shot region, as shown in FIGS. 3B and 3C. The controller 1100 controls the wafer stage WS to align the marks 32 on the wafer 3 with the detection regions of the plurality of detectors 21a, 21b, and 21c of the detection apparatus 100 and obtains the coordinate positions of the marks 32. At this time, the controller 1100 controls the wafer stage WS so as to detect a plurality of marks set as the measurement targets in a shortest possible time. More specifically, the controller 1100 aligns the mark 32 on the wafer 3 so as to be located within the detection region and the depth of focus of each of at least two detectors of the plurality of detectors 21a, 21b, and 21c of the detection apparatus 100, thereby simultaneously detecting the positions of the two marks. For example, as shown in FIG. 3B, the controller 1100 performs a measurement operation while simultaneously aligning two marks 32F and 32G on the wafer 3 with the detectors 21a and 21b, respectively. The detectors used for measurement can be changed in accordance with the layout of the marks on the wafer 3. For example, as shown in FIG. 3C, the controller 1100 performs a measurement operation while simultaneously aligning marks 32L and 32M on the wafer 3 with the detectors 21b and 21c, respectively. Further, as shown in FIG. 3D, the controller 1100 can perform a measurement operation while simultaneously aligning three marks 32R, 32S, and 32T on the wafer 3 so as to be located within the detection regions and the depths of focus of the three detectors 21a, 21b, and 21c, respectively. With this operation, compared with a case in which measurement operations are performed while sequentially aligning the plurality of marks 32 on the wafer 3 with the detection region of one detector and, the drive time of the wafer stage WS and the measurement time of the detection apparatus 100 can be shortened.

The controller 1100 calculates the shift, the magnification, or the rotation of the array (lattice array) of shot regions 34 on the wafer 3 using a global alignment method based on the measurement results obtained by the detection apparatus 100 as described above. The controller 1100 performs correction or trapezoidal correction of each item based on the calculation result, and determines the regularity of the lattice array. After that, the controller 1100 obtains a correction coefficient from a reference baseline and the determined regularity of the lattice array, and performs alignment of the wafer 3 and the exposure light based on the result.

Figure 4A:
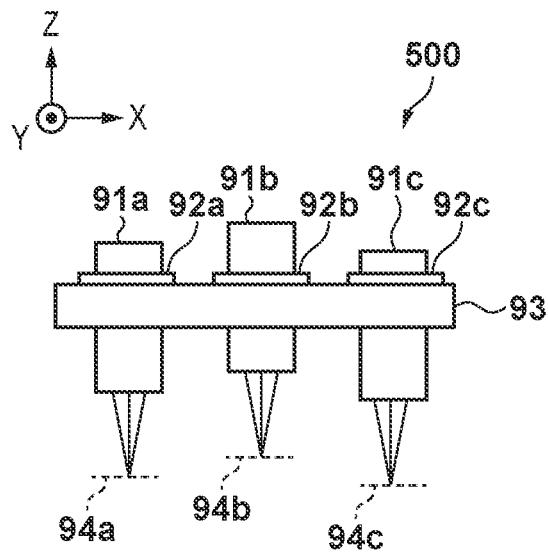
FIGS. 4A to 4D are views for explaining a shift of the measurement value of a mark in the related art.

In the related art, when the orientation of a wafer is changed with respect to a detection apparatus and a plurality of marks on a substrate are simultaneously measured, a shift of a measurement value occurs due to the change in orientation of the wafer. A detailed description of the shift will be provided here. An error in the detection apparatus and a distortion of the substrate are two factors each of which causes a relative shift between each of the focal planes of the plurality of detectors forming the detection apparatus and the position of the mark on the substrate in the Z direction. FIG. 4A is a view showing the arrangement of a detection apparatus 500, in which focal planes 94a, 94b, and 94c of a plurality of detectors 91a, 91b, and 91c are shifted in the Z direction. The following factors can cause the shift of the focal planes 94a, 94b, and 94c in the Z direction.

(1) A difference in performance among the plurality of detectors 91a, 91b, and 91c or a shift of a mounting position with respect to a measurement frame 93.

(2) A positional shift in the Z direction or a change in orientation of each of the detectors 91a, 91b, and 91c caused by driving mechanisms 92a, 92b, and 92c.

Figure 4B:
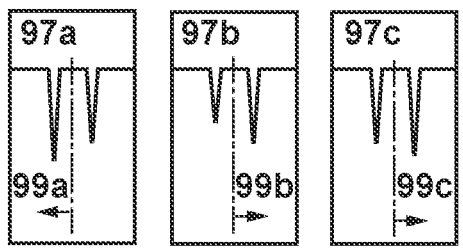

As a conventional method for addressing these factors, there is a method of calculating measurement offset values of a plurality of mark measurement systems to perform correction. When calculating the measurement offset value, a method of aligning the same mark with each detector and calculating the measurement offset value based on the measurement value of the mark and the position information of the wafer stage WS can be used. That is, the same mark on the wafer is moved in the X direction and the Z direction to be sequentially aligned with the focal planes 94a, 94b, and 94c of the plurality of detectors 91a, 91b, and 91c, and positions of the mark are detected. Waveforms 97a, 97b, and 97c shown in FIG. 4B are signal waveforms each representing the intensity distribution of the reflected light from the mark, obtained when the same mark is detected using the plurality of detectors 91a, 91b, and 91c, respectively. For example, the abscissa corresponds to the position of the mark in the X direction, and the ordinate corresponds to the intensity distribution of the reflected light from the mark.

Since the waveforms 97a, 97b, and 97c change due to the difference in performance among the plurality of detectors 91a, 91b, and 91c, a positional shift occurs in the center position of the waveform calculated by processing the signal waveform. Measurement values 99a, 99b, and 99c represented by arrows in FIG. 4B are the measurement values of the mark with respect to the detection regions of the plurality of detectors 91a, 91b, and 91c. The conventional detection apparatus corrects the measurement value of the mark using the difference between these measurement values as the measurement offset values of the plurality of detectors. For example, the difference value between each of the measurement values 99b and 99c and the measurement value 99a is calculated as the measurement offset value of each of the detectors 91b and 91c with respect to the detector 91a. Then, by adding the measurement offset value to the measurement value of the mark set as the measurement target on the wafer, the shift of the measurement value caused by the difference in performance among the plurality of detectors 91a, 91b, and 91c is corrected and alignment of the exposure light and the wafer is performed.

However, when the focal planes of the three or more detectors forming the detection apparatus and the position of the mark on the substrate in the Z direction are relatively shifted, defocus occurs, and the mark may not be aligned so as to be located within the detection regions and the depths of focus of all the detectors. As a result, there is a possibility that the measurement accuracy of the mark decreases and the alignment accuracy of the substrate and the exposure light decreases. To address this problem, there is a method of aligning the mark so as to be located within the detection region and the depth of focus of each of the plurality of detectors by inclining the substrate with respect to at least two detectors and performing alignment. In the case of two detectors, by changing the orientation of the substrate, it is possible to adjust the relative positional shift at the Z position between the detector and the mark on the substrate. However, when the orientation of the substrate is changed, a new problem arises that the measurement value changes in accordance with the orientation of the substrate.

Figure 4C:
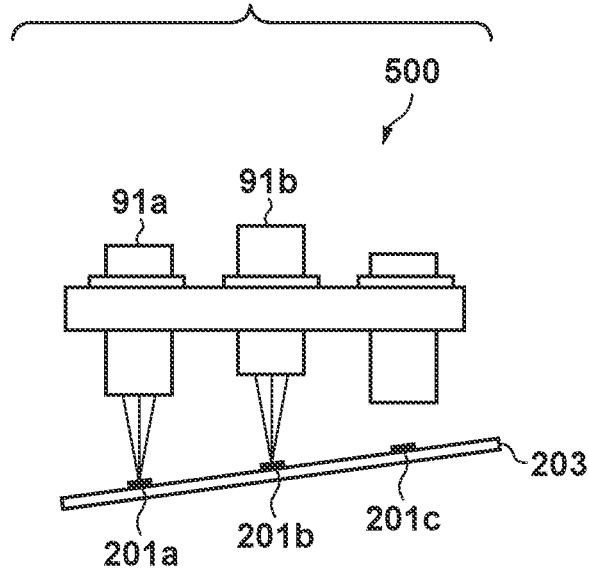
Figure 4D:
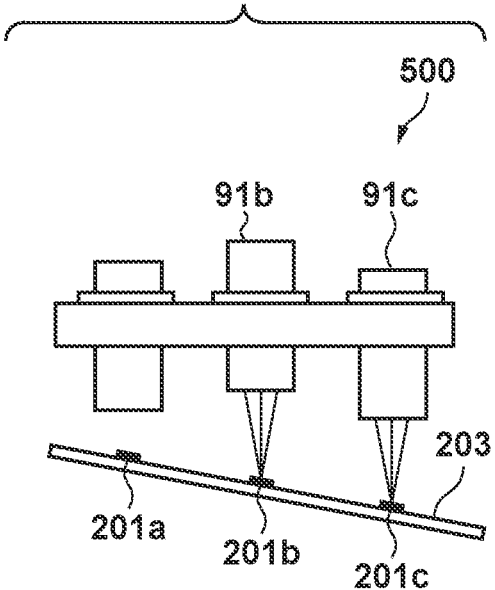

FIG. 4C is a view showing the orientation of a wafer 203 and waveforms 212a and 212b in a case in which the orientation of the wafer 203 is inclined with respect to the X-Y plane, and marks 201a and 201b are aligned so as to be located within the detection regions and the depths of focus of the plurality of detectors 91a and 91b, respectively. FIG. 4D is a view showing the orientation of the wafer 203 and waveforms 222b and 222c in a case in which the mark 201b and a mark 201c are aligned so as to be located within the detection regions and the depths of focus of the plurality of detectors 91b and 91c, respectively. When the orientations of the wafer 203 in FIGS. 4C and 4D are referred to as the first state and the second state, respectively, the angle of at least one of the illumination light and the detection light with respect to the wafer changes between the first state and the second state, so that the intensity distribution of the reflected light from the mark changes. As a result, the waveforms 212b and 222b have different shapes, and the measurement values 214b and 224b of the mark 201b with respect to the detection region of the detector 91b are different. Note that the change in the measurement value between the first state and the second state of the wafer 203 with respect to the detector 91b has been described so far, but the measurement value changes in accordance with the change in orientation of the wafer 203 also in each of the detectors 91a and 91c. According to the related art, the same measurement offset value is added to the measurement value of a given mark obtained by a given detector regardless of a change in orientation of the wafer. That is, since the shift of the measurement value caused by the change in orientation of the wafer is not considered, an error occurs in the measurement offset value, and this causes a problem that the alignment accuracy of the exposure light and the wafer decreases.

In order to obtain a measurement offset value considering a shift of the measurement value caused by a change in orientation of the wafer, the controller 1100 of the detection apparatus 100 according to this embodiment performs following operations for each of a plurality of predetermined combinations of the detectors selected from the plurality of detectors.

(1) The reference member supported by the wafer stage WS is inclined at an inclination according to the information of the position of the detection region and the focal position of each detector.

(2) The reference mark arranged on the reference member is aligned with each detector.

Then, the controller 1100 obtains the measurement offset value of each of the plurality of detectors as the correction information of the measurement result by each of the plurality of detectors, based on the measurement values each obtained by the alignment performed for each of the plurality of predetermined combinations. A specific example of this processing will be described below.

Figure 5A:
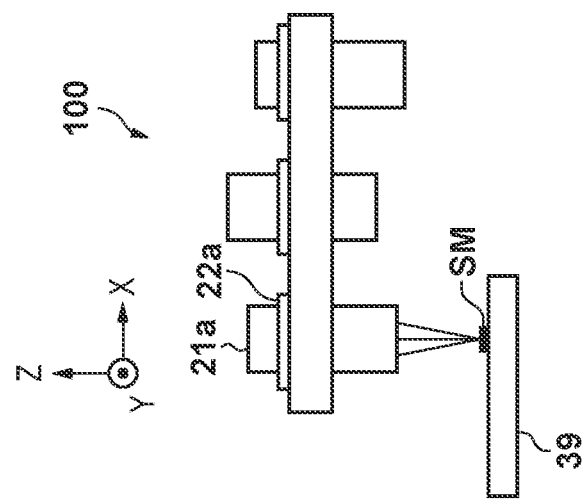
FIGS. 5A to 5D are views for explaining a method of determining an inclination according to information of the position of the detection region and the focal position of each detector according to the first embodiment.
Figure 5B:
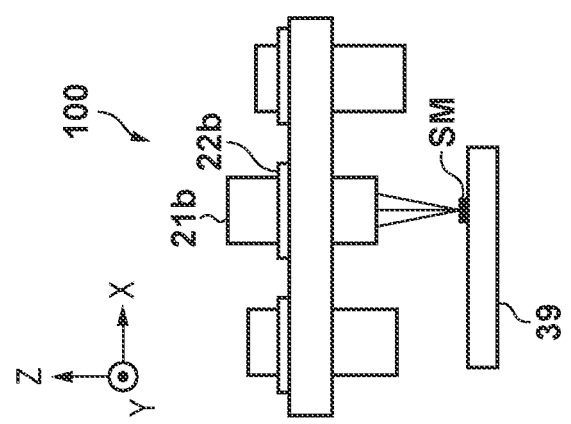
Figure 5C:
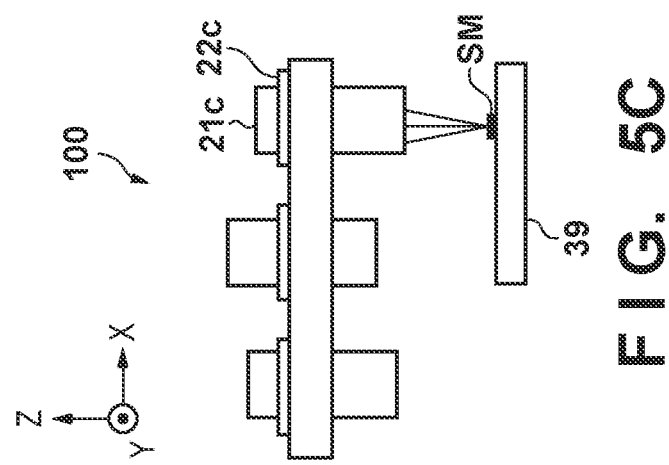
Figure 5D:
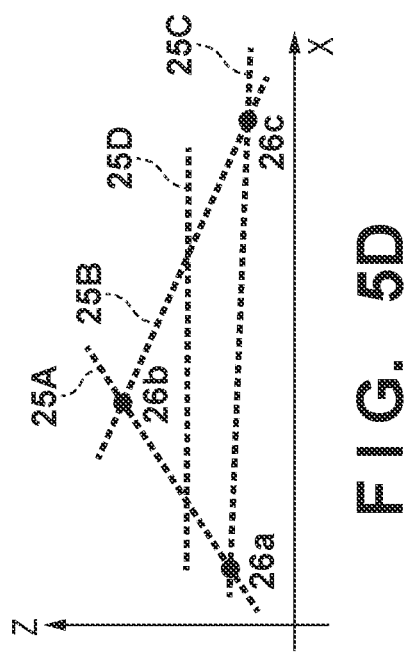

The information on the position of the detection region and the focal position of each detector is acquired in advance by performing alignment of the reference mark by controlling the wafer stage WS such that the reference mark is located within the detection region and the depth of focus of each of the plurality of detectors. A specific example of this processing will be described in detail with reference to FIGS. 5A to 5D. As shown in FIGS. 5A to 5C, the controller 1100 sequentially moves at least one mark SM on the reference member 39 supported by the wafer stage WS so as to be located within the detection region and the depth of focus of each of the plurality of detectors. This movement is performed, for example, based on the position information of the detector and the reference member 39 registered in the exposure apparatus in advance. Note that a mark on the wafer may be used instead of the mark SM on the reference member 39. Then, the controller 1100 acquires the information on the position of the detection region and the focal position of the detector based on, for example, the signal waveform of the mark obtained when the wafer is moved in the Z direction and the measurement value of the mark in the X-Y plane. In addition, the controller 1100 can acquire the surface height information of the mark set as the measurement target from the surface position information of the wafer measured using a surface position detection apparatus (not shown). FIG. 5D shows coordinate points each representing the position of the detection region and the focal position of each detector, with the abscissa representing the position of the detection region and the ordinate representing the focal position. Coordinate points 26a, 26b, and 26c are coordinate points representing the positions of the detection regions and the focal positions of the plurality of detectors 21a, 21b, and 21c, respectively. For example, in this embodiment, the plurality of detectors include the three detectors 21a, 21b, and 21c. In this case, the plurality of predetermined combinations are, for example, a combination of at least two detectors used to simultaneously measure a plurality of marks. Such combinations can include, for example, a first combination which is a combination of the first detector 21a and the second detector 21b, a second combination which is a combination of the second detector 21b and the third detector 21c, and a third combination which is a combination of the first detector 21a and the third detector 21c. Further, a fourth combination, which is a combination of the first detector 21a, the second detector 21b, and the third detector 21c, can be included.

In the detection apparatus 100 according to this embodiment, the controller 1100 obtains a first-order approximation equation of a line connecting the coordinate points each representing the position of the detection region and the focal position of each detector in each combination. For example, in the example shown in FIG. 5D, the following equations are obtained.

(1) For the first combination, a first-order approximation equation 25A of a line connecting the first coordinate point 26a representing the position of the detection region and the focal position of the first detector 21a and the second coordinate point 26b representing the position of the detection region and the focal position of the second detector 21b.

(2) For the second combination, a first-order approximation equation 25B of a line connecting the second coordinate point 26b and the third coordinate point 26c representing the position of the detection region and the focal position of the third detector 21c.

(3) For the third combination, a first-order approximation equation 25C of a line connecting the first coordinate point 26a and the third coordinate point 26c.

Furthermore, for the fourth combination, a first-order approximation equation 25D is obtained. The first-order approximation equation 25D is calculated using, for example, a least squares method so as to set the difference between the focal position and the surface height of the reference mark SM in each of the first detector 21a, the second detector 21b, and the third detector 21c to be equal to or smaller than an allowable value (for example, to be minimized). Each of inclinations of the first-order approximation equations 25A to 25D thus calculated corresponds to the amount by which the reference member 39 (that is, the reference mark SM) is to be inclined.

Figure 6A:
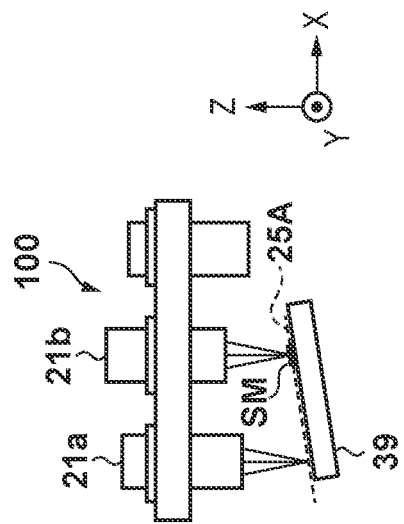
FIGS. 6A to 6I are views for explaining a method of calculating correction information according to the first embodiment.
Figure 6B:
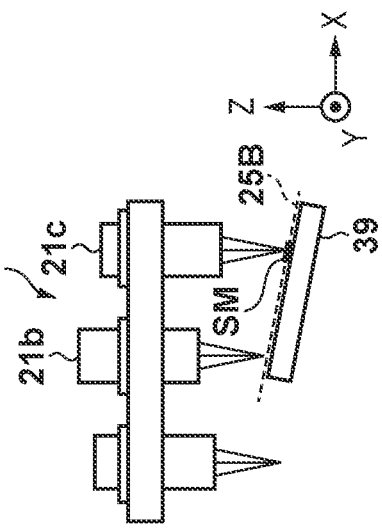
Figure 6C:
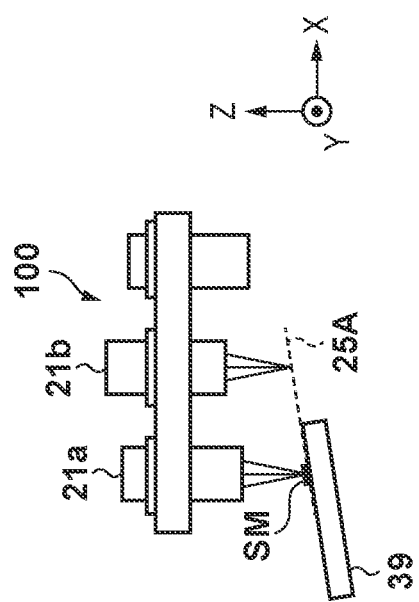
Figure 6D:
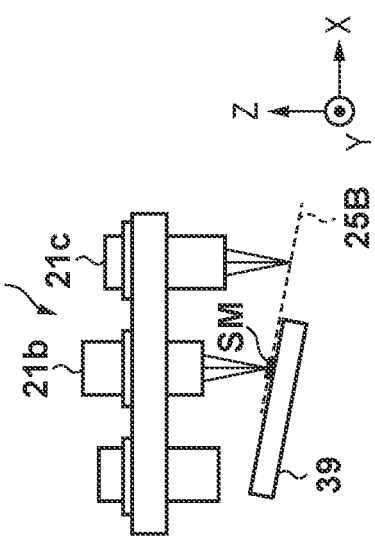
Figure 6E:
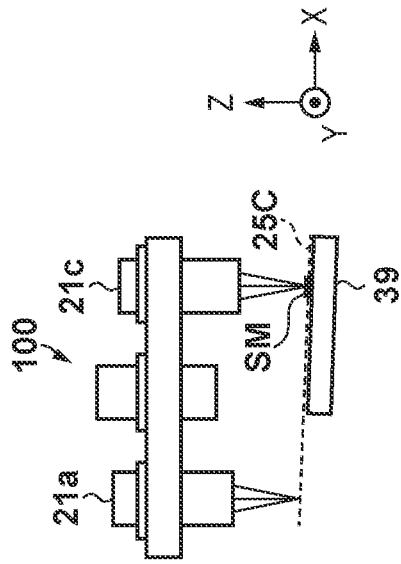
Figure 6F:
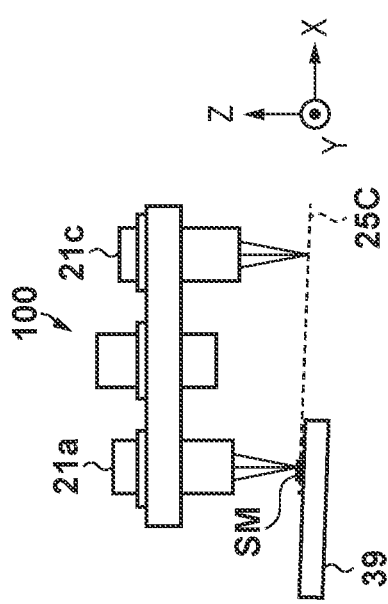
Figure 6G:
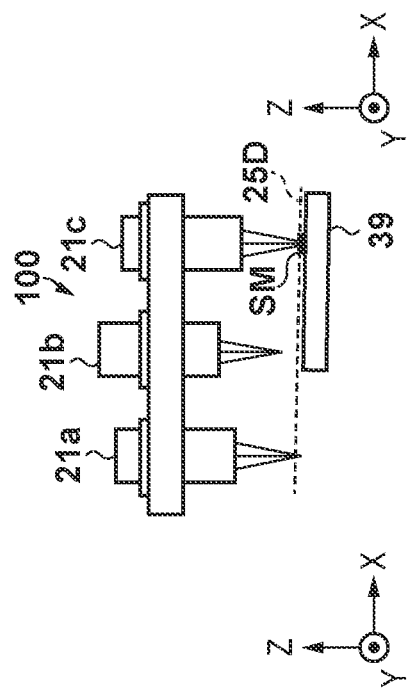
Figure 6H:
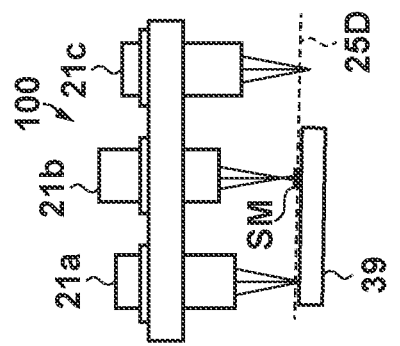
Figure 6I:
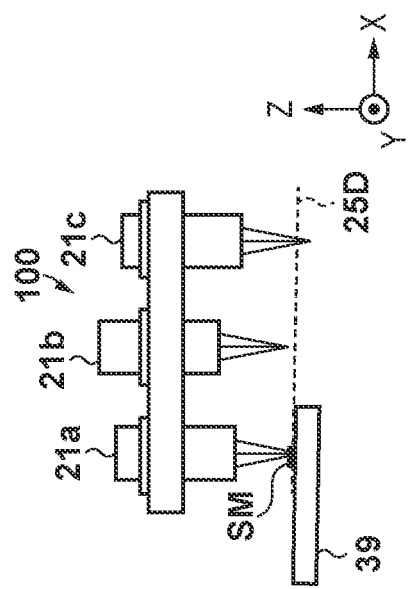

Next, calculation of correction information in the detection apparatus 100 will be described with reference to FIGS. 6A to 6I. Prior to calculation of correction information, as shown in FIGS. 6A to 6I, at least one mark SM on the reference member is moved so as to be located within the detection region and the depth of focus of each of the plurality of detectors in accordance with the inclination of each of the first-order approximation equations 25A to 25D, and the position of the mark SM is detected. For example, as shown in FIGS. 6A and 6B, the reference member 39 is inclined at the inclination of the first-order approximation equation 25A, and the same mark SM is moved so as to be located within the detection region and the focal depth of each of the first detector 21a and the second detector 21b to perform alignment sequentially. With this operation, measurement values Aa and Ab of the mark SM are acquired as inclination information. Similarly, as shown in FIGS. 6C and 6D, the reference member 39 is inclined at the inclination of the first-order approximation equation 25B, and the same mark SM is moved so as to be located within the detection region and the focal depth of each of the second detector 21b and the third detector 21c to perform alignment sequentially. With this operation, measurement values Bb and Bc of the mark SM are acquired as inclination information. Then, as shown in FIGS. 6E and 6F, the reference member 39 is inclined at the inclination of the first-order approximation equation 25C, and the same mark SM is moved so as to be located within the detection region and the focal depth of each of the first detector 21*a* and the third detector 21*c* to perform alignment sequentially. With this operation, measurement values Ca and Cc of the mark SM are acquired as inclination information. Further, as shown in FIGS. 6G to 6I, the reference member 39 is inclined at the inclination of the first-order approximation equation 25D, and the same mark SM is moved so as to be located within the detection region and the focal depth of each of the first detector 21*a*, the second detector 21*b*, and the third detector 21*c* to perform alignment sequentially. With this operation, measurement values Da, Db and Dc of the mark SM are acquired as inclination information.

As shown in FIG. 7A, the measurement values (inclination information) of the mark SM in the plurality of predetermined combinations are acquired by a sequence of alignment operations described above. Note that when moving the mark on the reference member so as to be located within the detection region and the depth of focus of each of the plurality of detectors in accordance with the inclination, the controller 1100 performs alignment by controlling the wafer stage WS based on, for example, the measurement value of the six-axis interferometer 81. In the detection apparatus 100, the mark to be moved so as to be located within the detection region and the depth of focus of each of the plurality of detectors in accordance with the inclination is not limited to the mark on the reference member, and a mark on the wafer 3 may be used.

When calculating correction information, the controller 1100 obtains the measurement offset value of each of the plurality of detectors from the difference between the measurement values each acquired by the alignment performed for each of the plurality of predetermined combinations as described above. For example, the controller 1100 obtains the following differences.

(1) The difference between the measurement values of the mark detected by different detectors in accordance with the inclination of each of the first-order approximation equations 25A to 25D.

(2) The difference between the measurement values of the same mark detected by the same detector with different inclinations of the reference member in accordance with the first-order approximation equations 25A to 25D.

Regarding (1) described above, more specifically, the controller 1100 obtains a difference ΔA between the measurement values Aa and Ab, a difference ΔB between the measurement values Bb and Bc, a difference ΔC between the measurement values Ca and Cc, a difference ΔD1 between the measurement values Da and Db, and a difference ΔD2 between the measurement values Db and Dc. This makes it possible to calculate the pieces of correction information ΔA to ΔD2 according to the inclinations of the first-order approximation equations 25A to 25D when the plurality of marks on the wafer are simultaneously detected using the plurality of detectors.

Regarding (2) described above, more specifically, the controller 1100 obtains a difference Δb1 between the measurement values Ab and Bb of the mark and a difference Δb2 between the measurement values Ab and Db of the mark. This makes it possible to calculate the correction information of the second detector 21*b* for different inclinations. Further, by obtaining a difference Δc between the measurement values Aa and Ca of the mark, the controller 1100 can calculate the correction information of the third detector 21*c* for the inclination of the first-order approximation equation 25B and for the inclination of the first-order approximation equation 25C. Thus, as shown in FIG. 7B, the measurement offset of the mark SM for each combination of the detectors is acquired.

Next, with reference to FIGS. 3B to 3D, a method of correcting the measurement values of the plurality of marks set as the measurement targets on the wafer by adding the correction information as the measurement offset will be described. For example, as shown in FIG. 3B, the difference ΔA is added as the measurement offset to the measurement value when the marks 32F and 32G set as the measurement targets are simultaneously detected using the first detector 21*a* and the second detector 21*b*. Further, as shown in FIG. 3C, the difference ΔB is added as the measurement offset to the measurement value when the marks 32L and 32M set as the measurement targets are simultaneously detected using the detectors 21*b* and 21*c*. Furthermore, for the measurement values of the marks 32G and 32L, the measurement value difference Δb1 is added as the measurement offset. Thus, for the measurement values of the marks 32F, 32G, 32L, and 32M, the shift of the measurement value caused by the difference between the detectors and the change in orientation of the wafer 3 can be corrected.

Note that the method of correcting the shifts of the measurement values using the differences ΔA, ΔB, and Δb1 has been described here, but the detection apparatus of the present invention is not limited thereto. For example, the correction information of the plurality of detectors 21*a*, 21*b*, and 21*c* corresponding to the inclinations of the first-order approximation equations 25A to 25D may be obtained in advance, and the measurement offset corresponding to the inclination information and the combination of the detectors at the time of detecting the marks set as the measurement targets may be added to the measurement value. Thus, when the plurality of marks on the wafer are simultaneously detected using the plurality of detectors, it is possible to correct the shift of the measurement value of the mark in accordance with a change in orientation of the wafer upon aligning each of the plurality of marks so as to be located within the detection region and the depth of focus of each of at least two detectors.

Further, in this embodiment, the method of obtaining the correction information by aligning one mark so as to be located within the detection region and the depth of focus of each of the plurality of detectors has been described with reference to FIGS. 5A to 7B, but the detection apparatus of the present invention is not limited thereto. For example, the correction information may be obtained by aligning each of the plurality of marks on an object so as to be located within the detection region and the depth of focus of each of the plurality of detectors in accordance with the inclination information. With this operation, it becomes possible to detect the plurality of marks on the object at high speed and with high accuracy by, for example, averaging the pieces of the correction information acquired for the plurality of marks and reducing an error caused by the shape of each mark. In addition, for example, among the pieces of the correction information acquired for the plurality of marks, the correction information acquired using a mark having the signal waveform symmetry or a small measurement error may be selected to correct the measurement value of the mark.

Figure 8A:
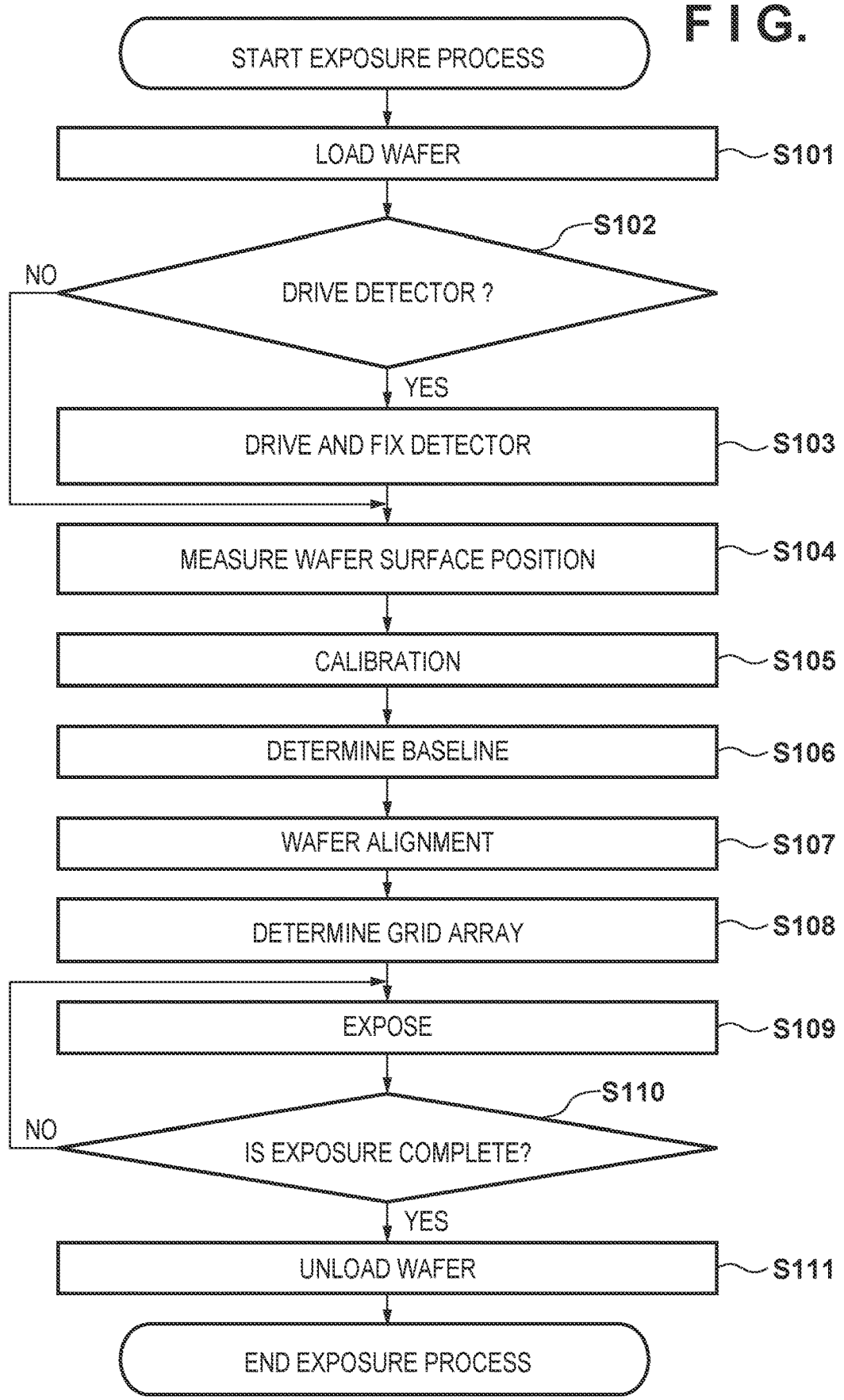
FIGS. 8A and 8B are flowcharts illustrating an exposure process according to the first embodiment.

An exposure method using the exposure apparatus 1 including the detection apparatus 100 will be described below in detail. FIG. 8A is a flowchart illustrating an exposure process performed by the exposure apparatus 1. In step S101, the controller 1100 loads the wafer 3 into the exposure apparatus 1. In step S102, the controller 1100 determines whether to drive at least one detector of the detection apparatus 100 with respect to the wafer 3. This determination is made based on, for example, information such as "the layout information of the mark to be measured", "the number of marks to be measured", "the exposure recipe performed immediately before", or "whether high productivity or accuracy is required" registered in the exposure apparatus by a user in advance. If it is determined in step S102 that the detector needs to be driven, the process advances to step S103, and the controller 1100 controls the driving mechanism in the detection apparatus 100 to drive and fix the detector. Prior to driving the detector, the position of the detector capable of simultaneously detecting a plurality of marks is determined based on "the layout information of the mark to be measured" registered in advance by the user. Then, the controller 1100 causes the driving mechanism of the detection apparatus 100 to move the detection region of at least one detector along the X direction. After step S103 is completed, the process advances to step S104. The process also advances to step S104 if it is determined in step S102 that the detection apparatus need not be driven.

In step S104, the controller 1100 detects the surface position on the wafer 3 and measures the shape of the entire surface of the wafer using the surface position detection apparatus (not shown). Note that if the detection apparatus is driven and fixed in step S103, step S104 may be performed in parallel with step S103.

In step S105, calibration before exposure is performed. More specifically, based on the designed coordinate position of the reference mark SM formed on the reference member in the stage coordinate system, the controller 1100 moves the wafer stage WS such that the reference mark SM is arranged on the optical axis of each of the plurality of detectors of the detection apparatus 100. The controller 1100 measures the positional shift of the reference mark SM with respect to the optical axes of the plurality of detectors, and resets the stage coordinate system based on the positional shift so that the origin of the XY coordinates coincides with the optical axis. After that, based on the designed positional relationship between the optical axis of the projection optical system 35 and the optical axis of the detection apparatus 100, the controller 1100 moves the wafer stage WS such that the reference mark SM is located on the optical axis of the exposure light. Then, the controller 1100 measures the positional shift of the reference mark with respect to the optical axis of the exposure light via the projection optical system 35 by a TTL detection system (not shown).

In step S106, based on the measurement result obtained in step S105, the controller 1100 determines a reference baseline between the optical axis of each of the plurality of detectors of the detection apparatus 100 and the optical axis of the projection optical system 35. In step S107, the controller 1100 detects the position of the mark on the wafer 3 by the detection apparatus 100, and aligns the X-Y plane of the wafer 3 with the exposure apparatus. In step S108, the controller 1100 calculates the shift, the magnification, or the rotation with respect to the array of the shot regions on the wafer 3 using a global alignment method based on the measurement result obtained in step S107, performs correction or trapezoidal correction of each item based on the calculation result, and determines the regularity of the lattice array. After that, the controller 1100 obtains a correction coefficient from the reference baseline and the determined regularity of the lattice array, and performs alignment of the wafer 3 and the exposure light based on the result.

In step S109, the controller 1100 performs exposure and scanning of the wafer stage WS in the Y direction. Note that at the time of exposure, adjustment to the shape of the wafer surface in the height direction for almost each exposure slit is also performed by driving the stage in the Z direction and the inclination direction based on the surface shape data of the shot region detected by the surface position detection apparatus. In step S110, the controller 1100 determines whether there is another shot region to be exposed (unexposed shot region), and repeats the above-described operation until there is no unexposed shot region. If exposure of all the exposure shots is completed, the wafer 3 is unloaded in step S111, and the exposure process is terminated.

Figure 8B:
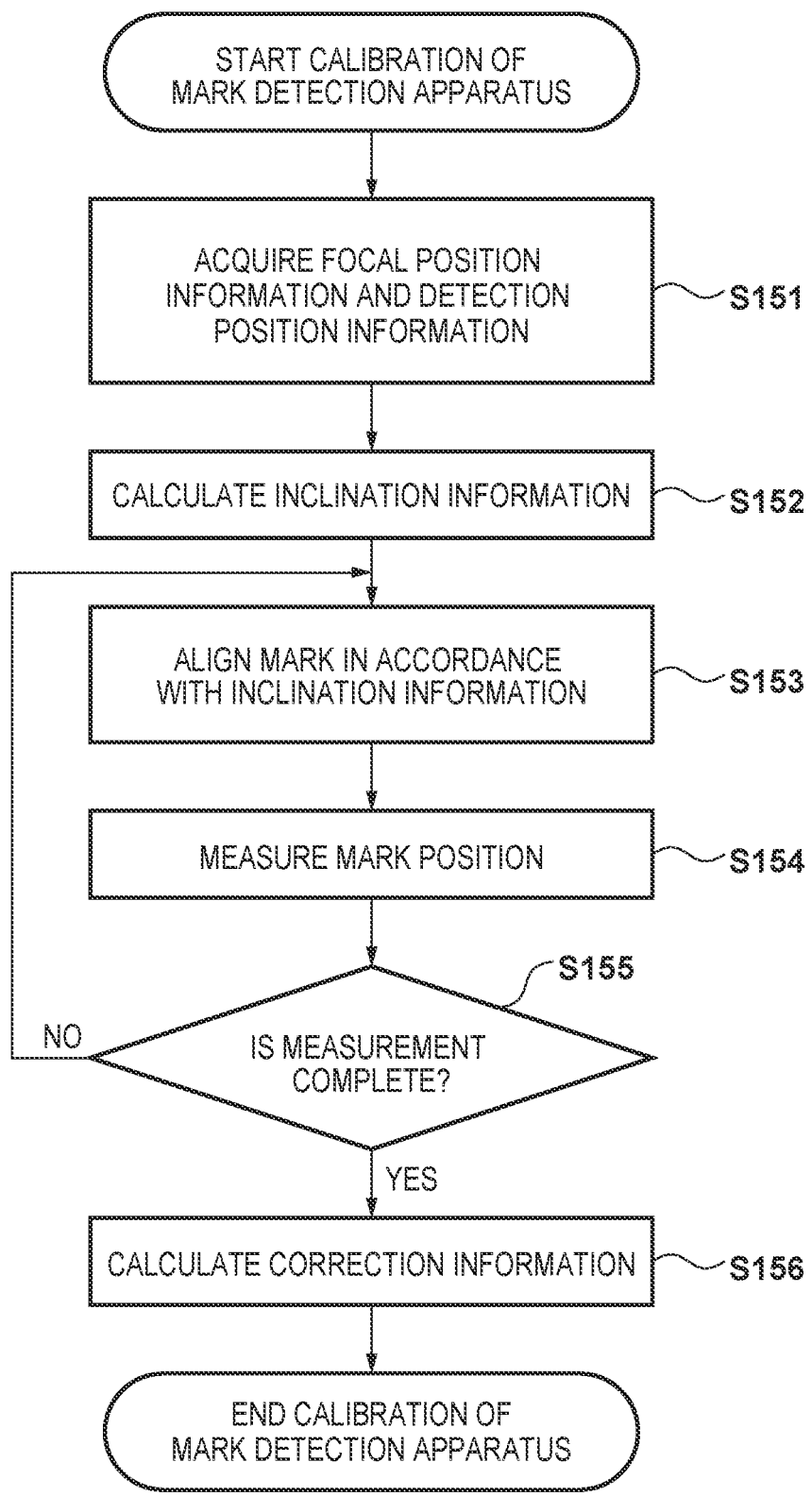

In this embodiment, at the time of performing calibration in step S105, calibration of the detection apparatus 100 is also performed as shown in FIG. 8B. In step S151, the controller 1100 aligns the reference mark SM so as to be located within the detection region and the depth of focus of each of the plurality of detectors and detects it, thereby acquiring position information of the detection region (detection position information) and information of the depth of focus (focal position information) of each detector. In step S152, the controller 1100 calculates inclination information from the focal position information and the position information of the detection region of each detector acquired in step S151 and the surface height information of the wafer measured by the surface position detection apparatus. In step S153, the controller 1100 aligns the reference mark SM so as to be located within the detection region and the depth of focus of the detector in accordance with the inclination information. In step S154, the controller 1100 measures the position of the aligned mark using the detector. In step S155, the controller 1100 determines whether there is another mark to be measured in accordance with the inclination information, and repeats the operations in steps S153 and S154 until there is no mark to be measured. In step S156, the controller 1100 calculates the correction information (the measurement offset value of each of the plurality of detectors) of the detection apparatus 100 based on the measurement values acquired in step S154.

As described above, according to this embodiment, the inclination information is calculated based on the information on the position of the detection region and the focal position of each of the plurality of detectors. In accordance with the inclination information, at least one mark on the object or the reference member is aligned so as to be located within the detection region and the depth of focus of each of the plurality of detectors. Then, the correction information (the measurement offset value of each of the plurality of detectors) of the detection apparatus 100 is obtained from the difference between the measurement values acquired by the plurality of detectors. In step S106, the controller 1100 determines the reference baseline between the optical axis of each of the plurality of detectors and the optical axis of the projection optical system 35 based on the obtained measurement offset value of each of the plurality of detectors.

According to the embodiment described above, it is possible to provide a technique advantageous in achieving both the speed and the accuracy in detection of a plurality of marks arranged on a substrate.

Second Embodiment

Next, a detection apparatus according to the second embodiment will be described with reference to FIGS. 9A and 9B. In the detection apparatus according to this embodiment, correction information of the detection apparatus is acquired at the time of performing a wafer alignment operation of detecting positions of a plurality of marks on a wafer using a plurality of detectors. By calculating the correction information of the detection apparatus using at least one measurement value of the mark measurement values obtained in the wafer alignment operation, it is possible to shorten the mark measurement time for acquiring the correction information.

Figure 9A:
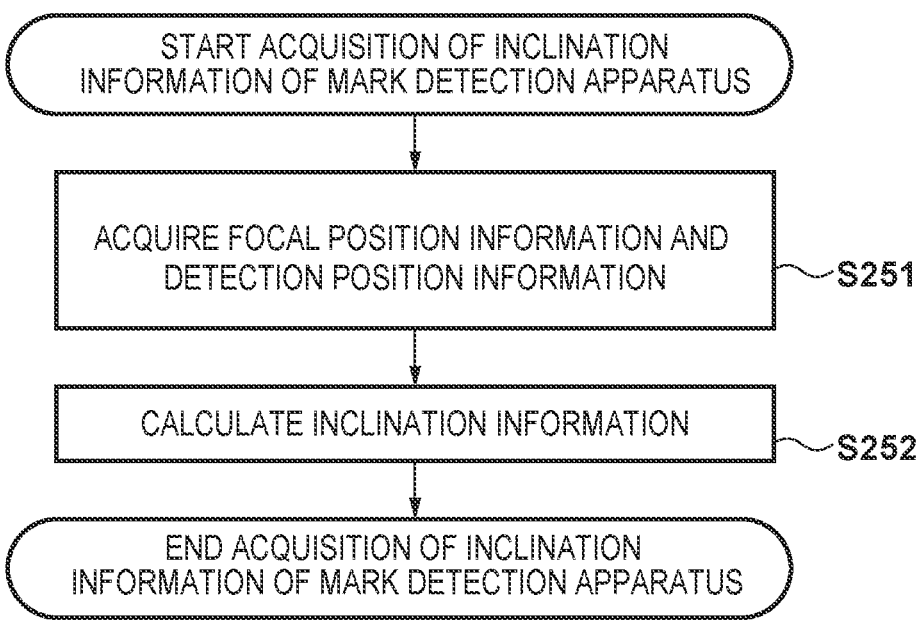
FIGS. 9A and 9B are flowcharts illustrating calibration of a detection apparatus according to the second embodiment.

FIG. 9A is a flowchart illustrating acquisition of inclination information in a detection apparatus 100. In the detection apparatus 100 of this embodiment, as in the first embodiment, inclination information is acquired at the timing of performing calibration in step S105 of FIG. 8A. More specifically, in step S251, a controller 1100 aligns a reference mark SM so as to be located within the detection region and the depth of focus of each of the plurality of detectors and detects it, thereby acquiring information on the position of the detection region and the focal position of the detector. In step S252, the controller 1100 calculates inclination information from the information on the position of the detection region and the focal position of the detector acquired in step S251 and the surface height information of the wafer measured by a surface position detection apparatus.

Figure 9B:
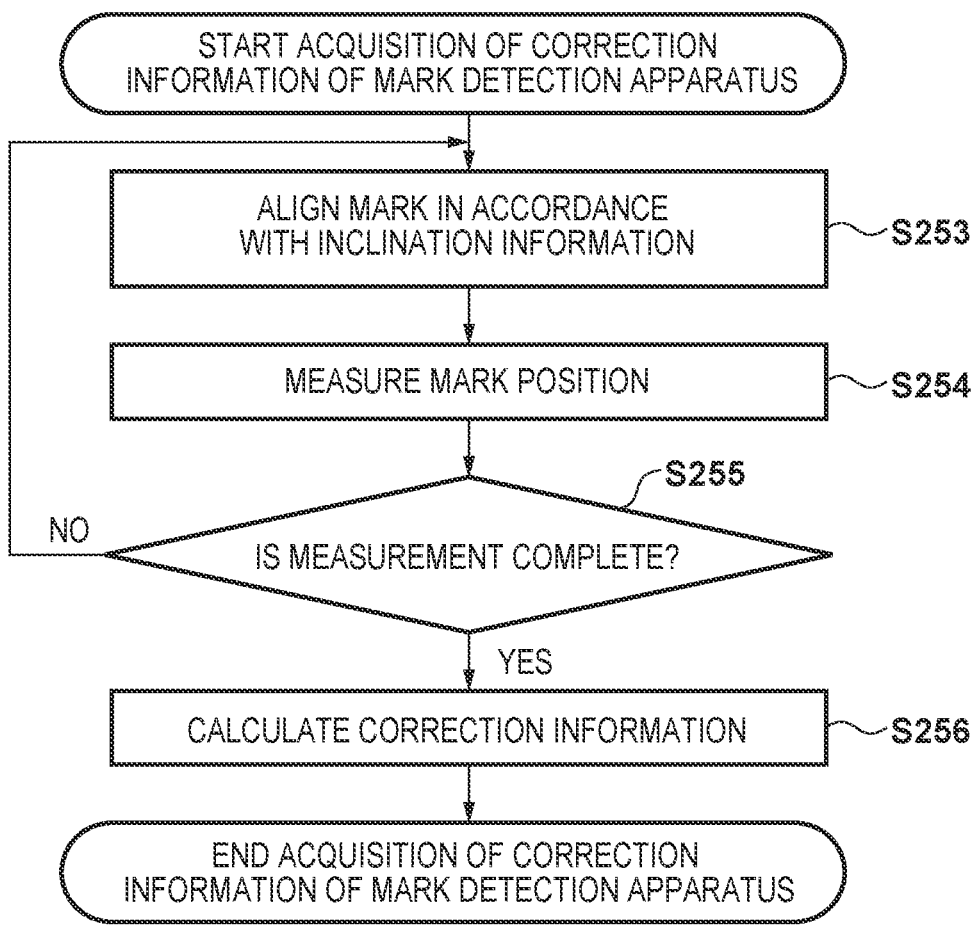

FIG. 9B is a flowchart illustrating correction information acquisition processing performed in the detection apparatus 100. In the detection apparatus 100 of this embodiment, unlike in the first embodiment, correction information is acquired at the timing of performing wafer alignment in step S107 of FIG. 8A. In step S253, the controller 1100 aligns the same mark on the wafer so as to be located within the detection region and the depth of focus of each of the plurality of detectors in accordance with the inclination information during the wafer alignment operation. In step S254, the controller 1100 measures the position of the aligned mark using the detector. The mark used to calculate the correction information is set based on, for example, "the layout information of the mark to be measured" and "the number of marks to be measured", registered in the exposure apparatus by a user in advance. Then, the controller 1100 performs both the wafer alignment operation and the operation of aligning the same mark on the wafer so as to be located within the detection region and the depth of focus of each of the plurality of detectors according to the inclination information. At this time, the controller 1100 sets the mark to be measured and an arithmetic processing method of correction information such that the correction information of the detection apparatus 100 is calculated using at least one measurement value of the measurement values of the marks detected in the wafer alignment operation. Thus, the wafer alignment operation and the operation of detecting the position of the mark to acquire the correction information are performed together, so that the mark measurement time can be shortened. In step S255, the controller 1100 determines whether there is another mark to be measured in accordance with the inclination information, and repeats the operations in steps S253 and S254 until there is no mark to be measured. In step S256, the controller 1100 calculates, based on the difference between the measurement values acquired in step S254, the correction information of the detection apparatus 100 in accordance with the change in orientation of the wafer.

Accordingly, this embodiment is different from the first embodiment in that the correction information is acquired not during the calibration operation but during the wafer alignment operation. Thus, the advantage of this embodiment is that the mark measurement time required for acquiring the correction information of the detection apparatus 100 can be shortened. In addition, according to this embodiment, by calculating, based on the measurement values of the mark on the wafer, the correction information including the change of the measurement value caused by the wafer process and performing correction, it becomes possible to align the exposure light and the substrate with high accuracy. Therefore, for example, it is preferable to selectively use the detection apparatus of the first embodiment and the detection apparatus of this embodiment in accordance with the required throughput or overlay accuracy. Thus, according to this embodiment, it is possible to provide a detection apparatus capable of detecting a plurality of marks on a substrate at high speed and with high accuracy, and an exposure apparatus including the detection apparatus.

Third Embodiment

Next, a detection apparatus according to the third embodiment will be described with reference to FIG. 10. In a detection apparatus 100 according to this embodiment, a controller 1100 calculates correction information of the detection apparatus 100 based on a correction table showing the relationship between the inclination amount and the shift of the measurement value, and the inclination information. Accordingly, the correction information can be obtained in a shorter time than in the first embodiment.

Figure 10:
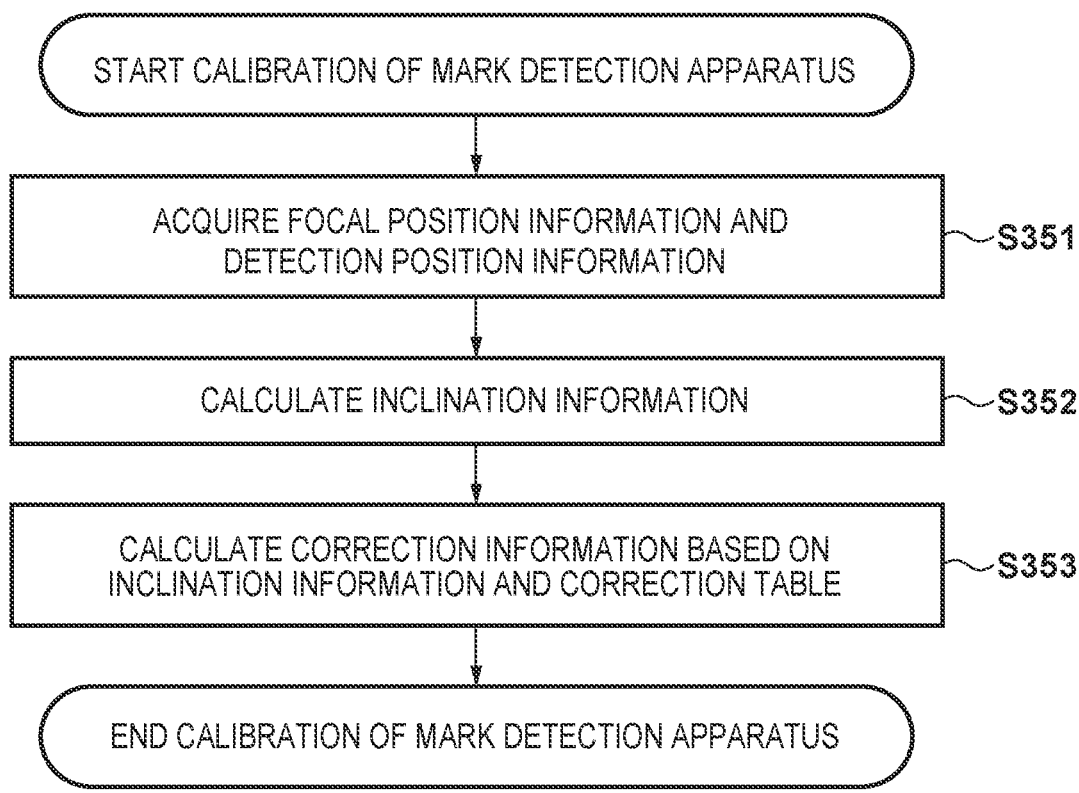
FIG. 10 is a flowchart illustrating calibration of a detection apparatus according to the third embodiment.

FIG. 10 is a flowchart illustrating calibration of the detection apparatus 100. In this embodiment, calibration of the detection apparatus 100 is performed at the timing of performing calibration in step S105 of FIG. 8A, as in the first embodiment. More specifically, in step S351, the controller 1100 aligns a reference mark SM so as to be located within the detection region and the depth of focus of each of a plurality of detectors and detects it, thereby acquiring information on the position of the detection region and the focal position of the detector. In step S352, the controller 1100 calculates inclination information from the information on the position of the detection region and the focal position of the detector acquired in step S351 and the surface height information of the wafer measured by a surface position detection apparatus. In step S353, the controller 1100 calculates the correction information of the detection apparatus 100 based on the inclination information obtained in step S352 and a correction table showing the relationship between the inclination amount and the shift of the measurement value. The inclination amount shown in the correction table is classified into items such as the focal position information of the detection apparatus 100, the position information of the detection region, the surface height information of the wafer, and the like, and the relationship with the shift of the measurement value is shown in accordance with the amount in each item. Further, the shift of the measurement value shown in the correction table is generated based on a calculation result based on the wafer process, the shape of the mark, the measurement condition (wavelength, illumination a, polarization, or the like) of the detection apparatus, or an actual measurement result.

Accordingly, this embodiment is different from the first embodiment in that the correction information is acquired based on the inclination information and the correction table. Thus, the advantage of this embodiment is that the mark measurement time required for acquiring the correction information of the detection apparatus can be shortened as compared with the first and second embodiments. Thus, according to this embodiment, it is possible to provide a technique advantageous in achieving both the speed and the accuracy in detection of a plurality of marks arranged on a substrate.

Fourth Embodiment

Next, a detection apparatus according to the fourth embodiment will be described with reference to FIG. 11. In a detection apparatus 100 according to this embodiment, a controller 1100 calculates correction information of the detection apparatus 100 based on calculated inclination information and a correction table. Accordingly, the correction information can be obtained in a shorter time than in the first embodiment.

Figure 11:
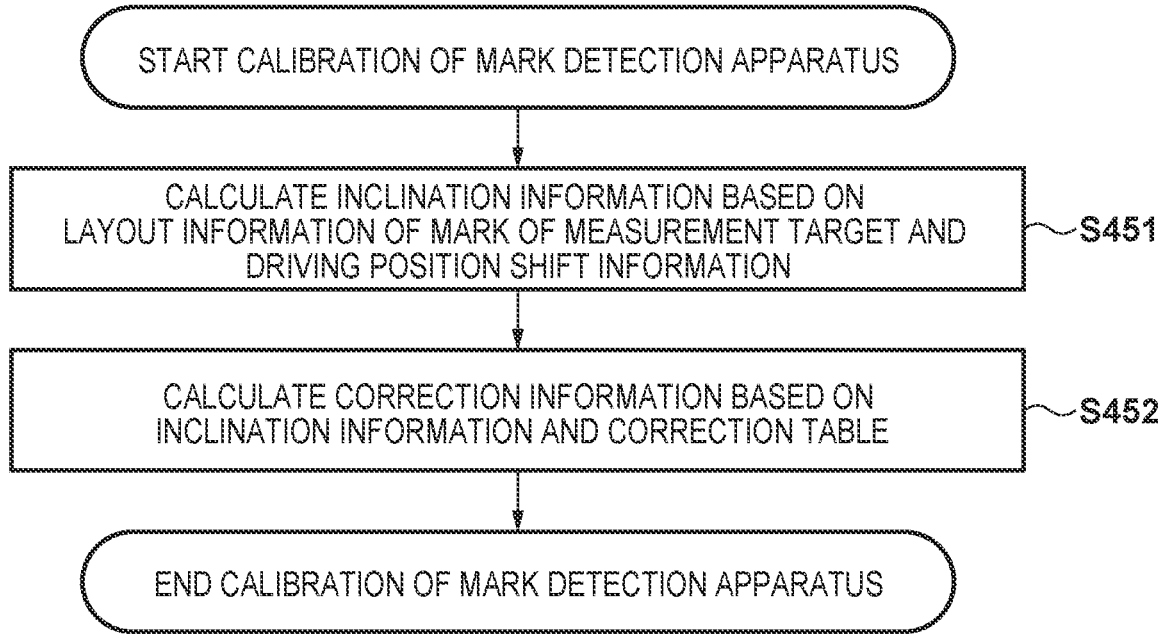
FIG. 11 is a flowchart illustrating calibration of a detection apparatus according to the fourth embodiment.

FIG. 11 is a flowchart illustrating calibration of the detection apparatus 100. In this embodiment, unlike in the first embodiment, calibration of the detection apparatus 100 is performed at the timing of loading a wafer in step S101 of FIG. 8A. More specifically, in step S451, the controller 1100 calculates inclination information of the detection apparatus 100 based on the layout information of a mark to be measured and the drive position shift information. The layout information of a mark to be measured is information registered in the exposure apparatus by a user in advance. The drive position shift information is, for example, a result of acquiring a drive position shift amount in advance, that occurs when a plurality of detectors of the detection apparatus are driven, in accordance with the drive position, the drive amount, and the drive speed. In step S452, as in step S353 in the third embodiment, the controller 1100 calculates the correction information of the detection apparatus 100 based on the inclination information calculated in step S451 and a correction table showing the relationship between the inclination amount and the shift of the measurement value.

Accordingly, this embodiment is different from the first to third embodiments in that the correction information is acquired based on the calculated inclination information and the correction table at the timing of loading a wafer. Thus, the advantage of this embodiment is that the mark measurement time required for acquiring the correction information of the detection apparatus can be shortened as compared with the first to third embodiments. Thus, according to this embodiment, it is possible to provide a technique advantageous in achieving both the speed and the accuracy in detection of a plurality of marks arranged on a substrate.

Embodiment of Article Manufacturing Method

An article manufacturing method according to an embodiment of the present invention suitably manufactures an article, for example, a microdevice such as a semiconductor device or an element having a microstructure. The article manufacturing method of this embodiment includes a step of forming a latent pattern by using the above-described exposure apparatus on a photosensitive agent applied on a substrate (a step of exposing the substrate), and a step of developing the substrate on which the latent pattern has been formed in the above step. In addition, the manufacturing method includes other well-known steps (oxidation, film formation, deposition, doping, planarization, etching, resist removal, dicing, bonding, packaging, and the like). The article manufacturing method of this embodiment is more advantageous than the conventional methods in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-123134, filed Jul. 1, 2019, which is hereby incorporated by reference herein in its entirety.

What is claimed is:

1. A detection apparatus for detecting a plurality of marks arranged on a substrate, the detection apparatus comprising:
   a stage configured to support the substrate and a reference member including a reference mark, and change a position and an orientation of the substrate and the reference member;
   a plurality of detectors arranged apart from each other and configured to detect different marks of the plurality of marks arranged on the substrate supported by the stage; and
   a controller configured to control the stage and the plurality of detectors, wherein the controller:
      for each of a plurality of predetermined combinations of the detectors selected from the plurality of detectors, inclines the reference member supported by the stage at an inclination according to information on a position of a detection region and a focal position of each detector, and controls the stage to align the reference mark with each of the plurality of detectors; and
      obtains a measurement offset value of each of the plurality of detectors based on measurement values, of the plurality of detectors, each acquired by aligning the reference mark for each of the plurality of predetermined combinations.

2. The apparatus according to claim 1, wherein the information of each of the plurality of detectors is acquired in advance by aligning the reference mark while controlling the stage to locate the reference mark within a detection region and a depth of focus of each of the plurality of detectors.

3. The apparatus according to claim 1, wherein the controller obtains the measurement offset value of each of the plurality of detectors from a difference between the measurement values.

4. The apparatus according to claim 1, wherein the inclination corresponds to an inclination of a first-order approximation equation of a line connecting coordinate points each representing the position of the detection region and the focal position of each detector.

5. The apparatus according to claim 4, wherein:
   the plurality of detectors include a first detector, a second detector, and a third detector,
   the plurality of predetermined combinations include a first combination of the first detector and the second detector, a second combination of the second detector and the third detector, and a third combination of the first detector and the third detector, and
   the controller:
      for the first combination, aligns the reference mark while inclining the reference member at an inclination of a first-order approximation equation of a line connecting a first coordinate point representing a position of a detection region and a focal position of the first detector and a second coordinate point representing a position of a detection region and a focal position of the second detector, and acquires the measurement value of the first detector and the measurement value of the second detector;

for the second combination, aligns the reference mark while inclining the reference member at an inclination of a first-order approximation equation of a line connecting the second coordinate point and a third coordinate point representing a position of a detection region and a focal position of the third detector, and acquires the measurement value of the second detector and the measurement value of the third detector; and for the third combination, aligns the reference mark while inclining the reference member at an inclination of a first-order approximation equation of a line connecting the first coordinate point and the third coordinate point, and acquires the measurement value of the first detector and the measurement value of the third detector.

6. The apparatus according to claim 5, wherein:
the plurality of predetermined combinations further include a fourth combination of the first detector, the second detector, and the third detector, and
the controller obtains, for the fourth combination, a first-order approximation equation that makes a difference between the focal position and a surface height of the reference mark in each of the first detector, the second detector, and the third detector not more than an allowable value, aligns the reference mark while inclining the reference member at the inclination of the first-order approximation equation, and acquires the measurement value of the first detector, the measurement value of the second detector, and the measurement value of the third detector.

7. An exposure apparatus for exposing a substrate, the exposure apparatus comprising:
a stage configured to support the substrate and a reference member including a reference mark, and change a position and an orientation of the substrate and the reference member;
a plurality of detectors arranged apart from each other and configured to detect different marks of a plurality of marks arranged on the substrate supported by the stage; and
a controller configured to control the stage and the plurality of detectors, wherein the controller:
for each of a plurality of predetermined combinations of the detectors selected from the plurality of detectors, inclines the reference member supported by the stage at an inclination according to information on a position of a detection region and a focal position of each detector, and controls the stage to align the reference mark with each of the plurality of detectors;
obtains a measurement offset value of each of the plurality of detectors based on measurement values, of the plurality of detectors, each acquired by aligning the reference mark for each of the plurality of predetermined combinations; and
controls positioning of the substrate based on detection results of the plurality of marks on the substrate supported by the stage that are obtained by the controller.

8. The apparatus according to claim 7, further comprising:
a projection optical system configured to project a pattern of a mask onto the substrate,
wherein the controller determines, based on the measurement offset value of each of a plurality of detectors, a reference baseline between an optical axis of each of the plurality of detectors and an optical axis of the projection optical system.

9. The apparatus according to claim 7, wherein the controller obtains the measurement offset value of each of the plurality of detectors at a timing of performing calibration before exposure.

10. The apparatus according to claim 7, wherein the controller obtains the measurement offset value of each of the plurality of detectors during a positioning operation of the substrate.

11. An article manufacturing method comprising:
exposing a substrate using an exposure apparatus comprising:
a stage configured to support the substrate and a reference member including a reference mark, and change a position and an orientation of the substrate and the reference member;
a plurality of detectors arranged apart from each other and configured to detect different marks of the plurality of marks arranged on the substrate supported by the stage; and
a controller configured to control the stage and the plurality of detectors, wherein the controller:
for each of a plurality of predetermined combinations of the detectors selected from the plurality of detectors, inclines the reference member supported by the stage at an inclination according to information on a position of a detection region and a focal position of each detector, and controls the stage to align the reference mark with each of the plurality of detectors;
obtains a measurement offset value of each of the plurality of detectors based on measurement values, of the plurality of detectors, each acquired by aligning the reference mark for each of the plurality of predetermined combinations; and
controls positioning of the substrate based on detection results of the plurality of marks on the substrate supported by the stage that are obtained by the controller; and
developing the exposed substrate,
wherein an article is manufactured from the developed substrate.

12. A detection apparatus for detecting a plurality of marks arranged on a substrate, the detection apparatus comprising:
a stage configured to support the substrate and change a position and an orientation of the substrate;
a plurality of detectors arranged apart from each other and configured to detect different marks of the plurality of marks arranged on the substrate supported by the stage; and
a controller configured to control the stage and the plurality of detectors, wherein the controller:
for each of a plurality of predetermined combinations of the detectors selected from the plurality of detectors, inclines the substrate supported by the stage at an inclination according to information on a position of a detection region and a focal position of each detector, and controls the stage to align a predetermined mark of the plurality of marks with each of the plurality of detectors; and
obtains a measurement offset value of each of the plurality of detectors based on measurement values, of the plurality of detectors, each acquired by aligning the predetermined mark for each of the plurality of predetermined combinations.

13. An exposure apparatus for exposing a substrate, the exposure apparatus comprising:
a stage configured to support the substrate and change a position and an orientation of the substrate;
a plurality of detectors arranged apart from each other and configured to detect different marks of the plurality of marks arranged on the substrate supported by the stage; and
a controller configured to control the stage and the plurality of detectors, wherein the controller:
for each of a plurality of predetermined combinations of the detectors selected from the plurality of detectors, inclines the substrate supported by the stage at an inclination according to information on a position of a detection region and a focal position of each detector, and controls the stage to align a predetermined mark of the plurality of marks with each of the plurality of detectors;
obtains a measurement offset value of each of the plurality of detectors based on measurement values, of the plurality of detectors, each acquired by aligning the predetermined mark for each of the plurality of predetermined combinations; and
controls positioning of the substrate based on detection results of the plurality of marks on the substrate supported by the stage that are obtained by the plurality of detectors.

14. An article manufacturing method comprising:
exposing a substrate using an exposure apparatus comprising:
a stage configured to support the substrate and change a position and an orientation of the substrate;
a plurality of detectors arranged apart from each other and configured to detect different marks of the plurality of marks arranged on the substrate supported by the stage; and
a controller configured to control the stage and the plurality of detectors, wherein the controller:
for each of a plurality of predetermined combinations of the detectors selected from the plurality of detectors, inclines the substrate supported by the stage at an inclination according to information on a position of a detection region and a focal position of each detector, and controls the stage to align a predetermined mark of the plurality of marks with each of the plurality of detectors;
obtains a measurement offset value of each of the plurality of detectors based on measurement values, of the plurality of detectors, each acquired by aligning the predetermined mark for each of the plurality of predetermined combinations; and
controls positioning of the substrate based on detection results of the plurality of marks on the substrate supported by the stage that are obtained by the plurality of detectors; and
developing the exposed substrate,
wherein an article is manufactured from the developed substrate.

15. A detection apparatus for detecting a mark, the detection apparatus comprising:
a stage configured to support an object and change a position and an orientation of the object;
a plurality of detectors arranged apart from each other and configured to detect different marks of a plurality of marks arranged on the object supported by the stage; and
a controller configured to control the stage and the plurality of detectors, wherein the controller:
for each of a plurality of predetermined combinations of the detectors selected from the plurality of detectors, inclines the object supported by the stage at an inclination according to information on a position of a detection region and a focal position of each detector, and controls the stage to align a predetermined mark of the plurality of marks with each of the plurality of detectors; and
obtains a measurement offset value of each of the plurality of detectors based on measurement values, of the plurality of detectors, each acquired by aligning the predetermined mark for each of the plurality of predetermined combinations.

16. The apparatus according to claim 15, wherein the object is a substrate on which the plurality of marks are arranged.

17. The apparatus according to claim 15, wherein the object is a reference member on which the plurality of marks are arranged.

18. An exposure apparatus for exposing a substrate, the exposure apparatus comprising:
a stage configured to support an object and change a position and an orientation of the object;
a plurality of detectors arranged apart from each other and configured to detect different marks of a plurality of marks arranged on the object supported by the stage; and
a controller configured to control the stage and the plurality of detectors, wherein the controller:
for each of a plurality of predetermined combinations of the detectors selected from the plurality of detectors, inclines the object supported by the stage at an inclination according to information on a position of a detection region and a focal position of each detector, and controls the stage to align a predetermined mark of the plurality of marks with each of the plurality of detectors;
obtains a measurement offset value of each of the plurality of detectors based on measurement values, of the plurality of detectors, each acquired by aligning the predetermined mark for each of the plurality of predetermined combinations; and
controls positioning of the substrate based on detection results of the plurality of marks on the object supported by the stage that are obtained by the plurality of detectors.

19. An article manufacturing method comprising:
exposing a substrate using an exposure apparatus comprising:
a stage configured to support an object and change a position and an orientation of the object;
a plurality of detectors arranged apart from each other and configured to detect different marks of a plurality of marks arranged on the object supported by the stage; and
a controller configured to control the stage and the plurality of detectors, wherein the controller:
for each of a plurality of predetermined combinations of the detectors selected from the plurality of detectors, inclines the object supported by the stage at an inclination according to information on a position of a detection region and a focal position of each detector, and controls the stage to align a predetermined mark of the plurality of marks with each of the plurality of detectors;

obtains a measurement offset value of each of the plurality of detectors based on measurement values, of the plurality of detectors, each acquired by aligning the predetermined mark for each of the plurality of predetermined combinations; and controls positioning of the substrate based on detection results of the plurality of marks on the object supported by the stage that are obtained by the plurality of detectors; and developing the exposed substrate, wherein an article is manufactured from the developed substrate.

* * * * *